United States Patent
Shiraiwa et al.

(10) Patent No.: US 6,667,212 B1
(45) Date of Patent: Dec. 23, 2003

(54) ALIGNMENT SYSTEM FOR PLANAR CHARGE TRAPPING DIELECTRIC MEMORY CELL LITHOGRAPHY

(75) Inventors: Hidehiko Shiraiwa, San Jose, CA (US); Jean Yee-Mei Yang, Sunnyvale, CA (US); Kouros Ghandehari, Santa Clara, CA (US)

(73) Assignees: Advanced Micro Devices, Inc., Sunnyvale, CA (US); Fujitsu Limited, Kawasaki (JP)

(*) Notice: Subject to any disclaimer, the term of this patent is extended or adjusted under 35 U.S.C. 154(b) by 0 days.

(21) Appl. No.: 10/394,565

(22) Filed: Mar. 21, 2003

(51) Int. Cl.[7] .......................................... H01L 21/8242
(52) U.S. Cl. ........................................ 438/261; 438/401
(58) Field of Search ................................ 438/261, 287, 438/401, 593, 594, 975

(56) References Cited

U.S. PATENT DOCUMENTS 5,468,664 A * 11/1995 Kajita ........................ 438/975
6,207,966 B1 * 3/2001 Nguyen et al. ............. 438/401
6,562,691 B2 * 5/2003 Chang et al. ............... 438/401
6,573,151 B1 * 6/2003 Ramsbey et al. ........... 438/401

* cited by examiner

Primary Examiner—Chandra Chaudhari
(74) Attorney, Agent, or Firm—Renner, Otto, Boisselle & Sklar, LLP

(57) ABSTRACT

A method of fabricating a charge trapping dielectric memory cell array comprises exposing a first photoresist to a first illumination pattern from a first mask to pattern bit line regions in a core region of the wafer and to pattern alignment mark regions. The alignment mark regions may be in a scribe lane region of the wafer. An impurity is implanted into the wafer within the bit line regions and the alignment mark regions and an oxide is grown on the surface of the wafer in the scribe lane region to produce oxide protrusions within the alignment mark regions. A second photoresist is exposed to a second illumination pattern from a second mask to pattern word line regions within the core region of the wafer and utilizing surface height variations of the oxide protrusions to detect alignment between the second mask and the first mask.

24 Claims, 9 Drawing Sheets

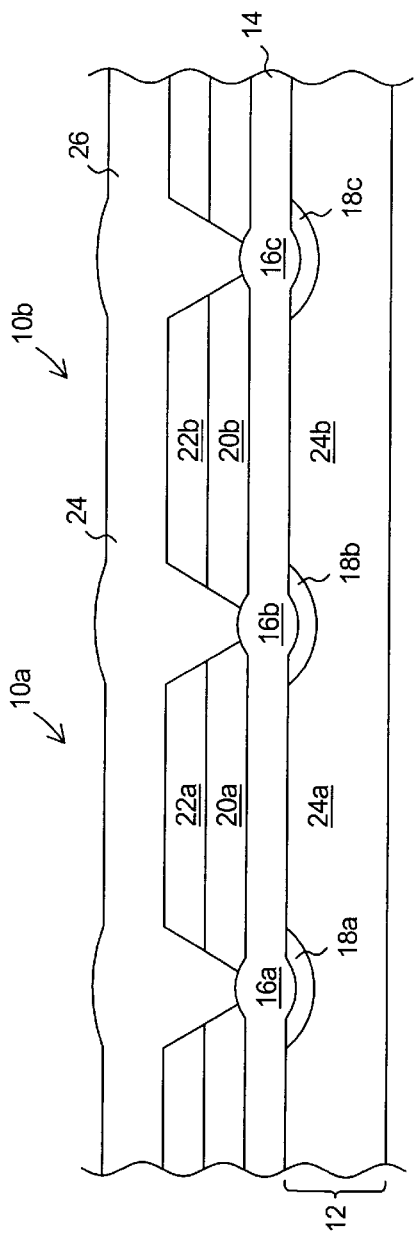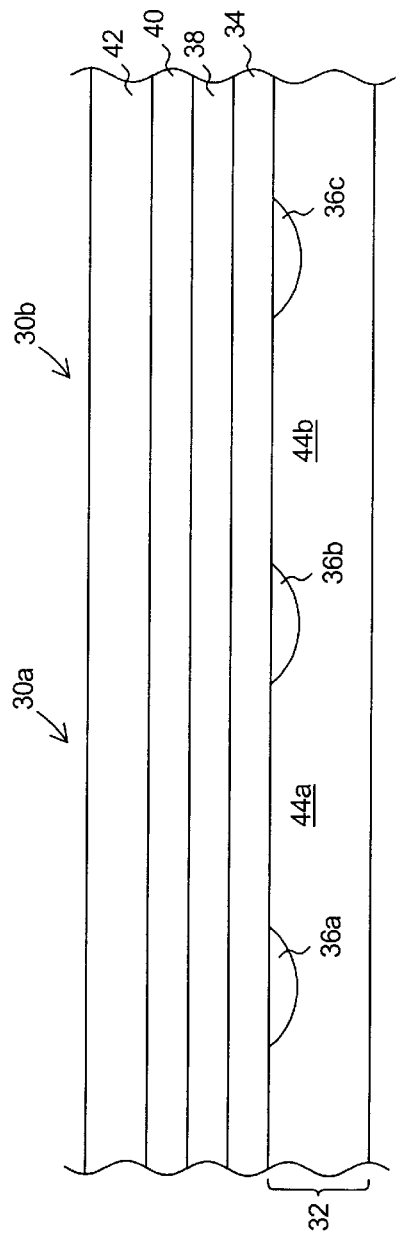
FIG. 1a
Prior Art
FIG. 1b
Prior Art

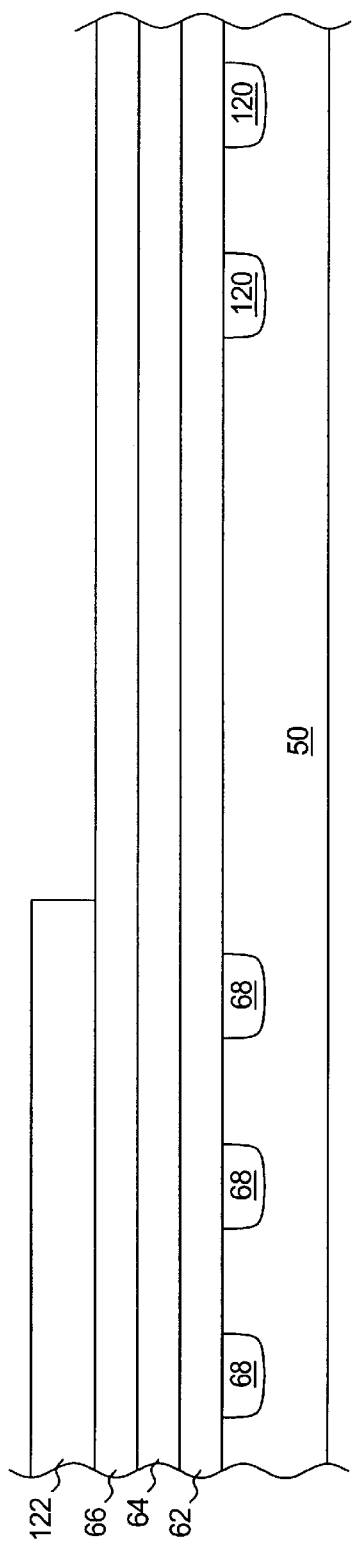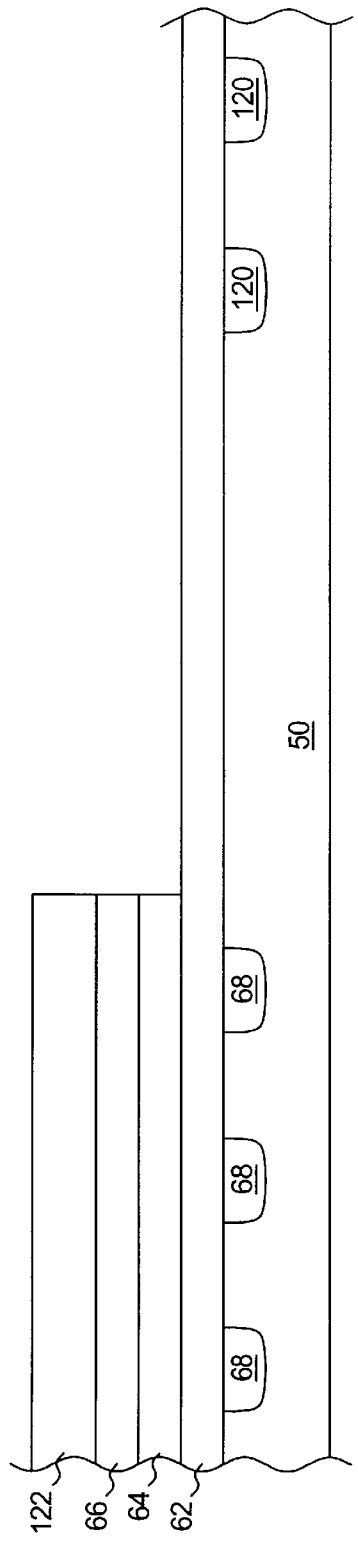

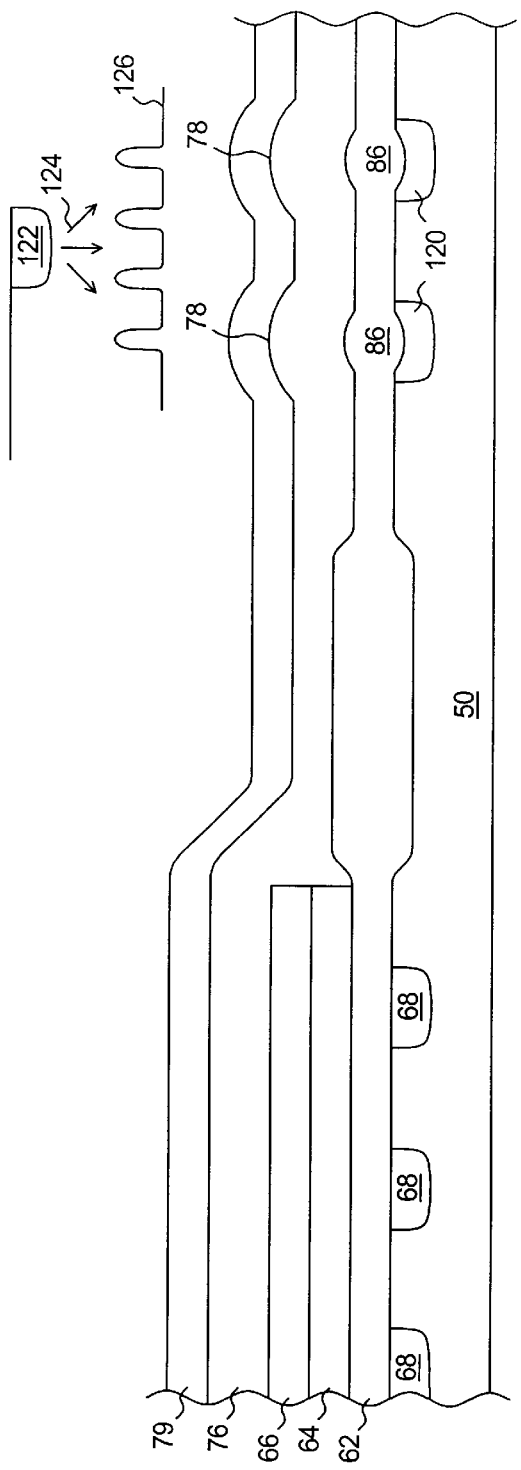
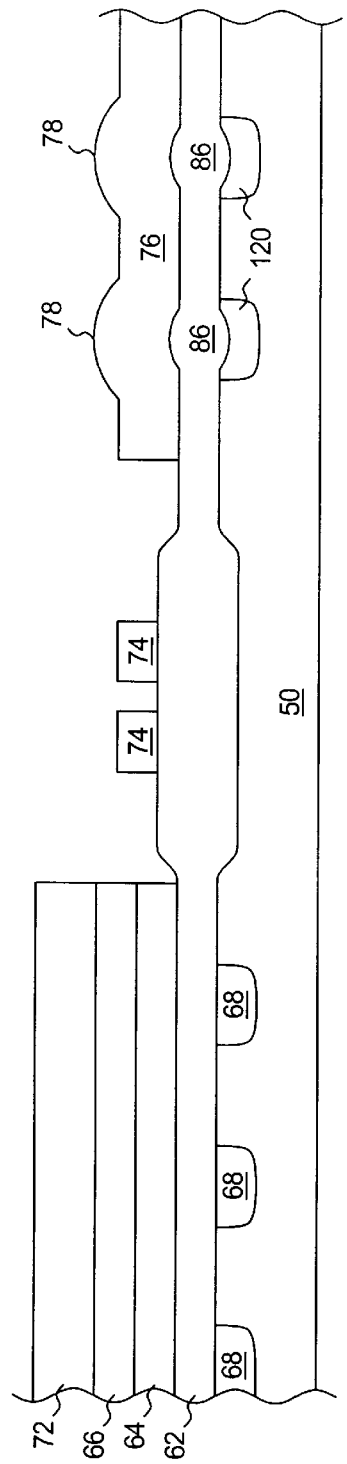
FIG. 3g
FIG. 3h

ALIGNMENT SYSTEM FOR PLANAR CHARGE TRAPPING DIELECTRIC MEMORY CELL LITHOGRAPHY

TECHNICAL FIELD

The present invention relates generally to flash memory cell devices and more specifically, to improvements in planar charge trapping dielectric memory cell structures or improved alignment between lithography processes.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate increases the threshold voltage of the FET characterized by the source region, drain region, channel region, and control gate. During a "read" of the memory cell, the magnitude of the current flowing between the source and drain at a predetermined control gate voltage indicates whether the flash cell is programmed.

More recently a charge trapping dielectric memory cell structure that includes bit line oxides has been developed. FIG. 1a represents a cross section of a portion of a row of such charge trapping dielectric memory cells (e.g. cells 10a and 10b). The cells 10a and 10b are fabricated on a semiconductor substrate 12. Each cell 10 is characterized by a vertical stack of an insulating tunnel layer 14 a charge trapping dielectric layer 20a, 20b, and a top dielectric layer 22a, 22b formed over channel regions 24a, 24b of the substrate 12. Such stack may be referred to as an ONO stack because the insulating tunnel layer 14 and the top dielectric layer 22 are typically an oxide while the center charge trapping dielectric layer 20 is typically a nitride compound. The channel regions 24 are separated from each other, and defined by, bitline implants 18a, 18b, and 18c within the substrate 12. The ONO stacks are separated from each other, and defined by bit line oxide regions 16a, 16b, and 16c which are areas of the tunnel dielectric layer 14 above the bit line implants 18 that are thicker than the areas of the tunnel dielectric layer 14 that are over the channel regions 24.

Above the ONO stacks are a plurality of spaced apart polysilicon word lines 26 that are perpendicular to the bit line implants 18. Each word line is positioned above the top dielectric layer 22 of all cells within a row.

Similar to the floating gate device, the charge trapping dielectric memory cell 10 is programmed by inducing hot electron injection from the channel region 24 to the nitride layer 20 to create a non volatile negative charge within charge traps existing in the nitride layer 20. Again, hot electron injection can be achieved by applying a drain-to-source bias (e.g. bit line 18b to bit line 18a bias for programming cell 10a) along with a high positive voltage on the polysilicon word line 26 which forms a control gate over the cell 10a. The high voltage on the word line 26 inverts the channel region 24a while the drain-to-source bias accelerates electrons towards the drain bitline 18b. The accelerated electrons gain 5.0 to 6.0 eV of kinetic energy which is more than sufficient to cross the 3.2 eV Si—$SiO_2$ energy barrier between the channel region 24 and the tunnel oxide layer 14. While the electrons are accelerated towards the drain bitline 18b, those electrons which collide with the crystalline lattice are re-directed towards the Si—$SiO_2$ interface under the influence of the control gate electrical field and have sufficient energy to cross the barrier.

Because the charge trapping layer 20 stores the injected electrons within traps and is otherwise a dielectric, the trapped electrons remain localized within a charge storage region that is close to the drain region bit line to which the positive voltage was applied. As such, the charge trapping dielectric memory device can be used to store two bits of data, one near each of the bit lines of each cell.

The array is typically fabricated by first applying the ONO layer to the top surface of the substrate, etching back the ONO layer to the top surface of the substrate in the bit line regions, implanting the bit line regions, oxidizing the bit line regions to form the bit line oxides, and then applying the word lines to the top of the remaining ONO layer and the bit line oxides.

It should be appreciated that the height variations caused by the bit line oxides within the etched away portions of the ONO layer modulate reflected alignment illumination such that a lithography stepper may use an optical alignment system to properly align the various masks used during fabrication.

FIG. 1b represents a cross section of a portion of a row of charge trapping dielectric memory cells (e.g. cells 30a and 30b) with a planar structure. Cells 30a and 30b are fabricated on a semiconductor substrate 32. Positioned over the semiconductor substrate 32 is a vertical stack of an insulating tunnel layer 34 a charge trapping dielectric layer 38, and a top dielectric layer 40 positioned over the substrate 32.

Within the substrate are a plurality of parallel, and spaced apart, bit line implants 36a, 36b, and 36c which define a plurality of channel regions 44a, 44b, each of which is between adjacent bit line implants. Above the top dielectric layer 40 are a plurality of parallel, spaced apart, polysilicon word lines which are perpendicular to the bit line implants 36 and the channel regions 44. Each dielectric memory cell is defined by an intersection of a word line 42 and a channel region 44.

A recognized advantage of the planar structure shown in FIG. 1b over the bit line oxide structure depicted in FIG. 1a is that the planar structure provides a more precise pattern of the word lines and such precision permits scaling of structures to a smaller size. However, a recognized disadvantage of the planar structure is that there are no surface height variations that can be optically detected for aligning the word line pattern (and various other critical mask patterns) to the bit lines during the fabrication process.

Consequently, a need exists for a fabrication process for fabricating planar structure charge trapping dielectric memory cells that provides for facilitating mask alignment between the various masking steps.

SUMMARY OF THE INVENTION

A first aspect of the present invention is to provide a method of fabricating a planar architecture charge trapping dielectric memory cell array. The method comprises exposing a first photoresist to a first illumination pattern from a first lithography mask to pattern bit line regions in a core region of the wafer and to simultaneously pattern alignment mark regions on the wafer. Such first photoresist may be over a composite charge trapping dielectric layer on the surface of the wafer. The alignment mark regions may be in a scribe lane region of the wafer.

An impurity, such as arsenic, is simultaneously implanted into the wafer within the bit line regions and the alignment mark regions. The composite charge trapping dielectric layer is removed over the alignment mark regions and the wafer is exposed to an environment conducive to oxide growth. Within the alignment mark regions, the implant enhances oxidation of the wafer such that the grown oxide includes oxide protrusions within the alignment mark regions.

A layer of polysilicon may then be deposited over the surface of the wafer followed by a second photoresist. A second photoresist is exposed to a second illumination pattern from a second lithography mask to pattern word line regions within the core region of the wafer. Surface height variations of the oxide protrusions in the scribe lane region are used to detect alignment between the second mask and the first mask. The surface height variations of the oxide protrusions cause surface height variations of the overlying polysilicon layer and second photoresist.

Thereafter, additional processing steps, such as contact formation, may utilize the surface height variations of the overlying polysilicon layer to detect alignment between subsequent masks and the first mask. The polysilicon is a highly reflective material and causes a greater contrast in reflected alignment illumination such that alignment is easier to detect.

The composite charge trapping dielectric may comprises a tunnel dielectric layer, a charge trapping dielectric layer, and a top dielectric layer. As such, applying the charge trapping dielectric over the surface of the wafer may comprise: i) applying the tunnel dielectric layer on the surface of the wafer (the tunnel dielectric may be oxide such that it is grown on the surface); ii) applying the charge trapping dielectric layer on the surface of the tunnel dielectric layer; and iii) applying the top dielectric layer on the surface of the charge trapping dielectric layer.

A second method of fabricating a planar architecture charge trapping dielectric memory cell in accordance with the present invention may comprise: i) applying a tunnel dielectric layer on the surface of the wafer (the tunnel dielectric may be oxide such that it is grown on the surface); ii) applying the charge trapping dielectric layer on the surface of the tunnel dielectric layer; and iii) applying the top dielectric layer on the surface of the charge trapping dielectric layer.

Following application of the top dielectric layer, a first photoresist is applied over the surface of the top dielectric layer of the composite charge trapping dielectric. The first photoresist is then exposed to a first illumination pattern from a first mask to simultaneously pattern bit line regions in a core region of the semiconductor wafer and alignment mark regions. The alignment mark regions may be in a scribe lane region of the semiconductor wafer.

The first photo resist is etched to expose the composite charge trapping dielectric within the bit line regions and within the alignment mark regions and an impurity is implanted into the exposed bit line regions and the exposed alignment mark regions.

The first photoresist is removed and a protective mask is applied over the core region while the top dielectric layer within the alignment mark region is exposed. Each of the top dielectric layer, the charge trapping dielectric layer, and the tunnel dielectric layer may be removed in the exposed alignment mark regions to expose at least one of the semiconductor wafer and an oxide on the surface of the semiconductor wafer in the scribe lane region. The protective mask is removed and an oxide is then grown on the exposed alignment mark region to produce oxide protrusions within the alignment mark regions.

A layer of polysilicon is applied over the wafer including the core region. A second photoresist is applied over the surface of the layer of polysilicon and exposed to a second illumination pattern from a second mask to pattern word line regions within the core region. Surface height variations of the oxide protrusions are used to detect alignment between the second mask and the first mask. The surface height variations of the oxide protrusions cause surface height variations of the layer of polysilicon and the second photoresist. And, the step of exposing a second photoresist to a second illumination pattern from a second mask to pattern word line regions within the core region utilizes a reflected illumination pattern from the second photoresist caused by the oxide protrusions.

The layer of polysilicon may also be over the periphery region of the semiconductor wafer, the periphery region being positioned between the core region and the scribe lane region. And, the step of exposing a second photoresist to a second illumination pattern from a second mask to pattern word line regions further patterns transistor gates within the periphery region.

Thereafter, additional processing steps, such as contact formation, may utilize the surface height variations of the overlying polysilicon layer to detect alignment between subsequent masks and the first mask. The polysilicon is a highly reflective material and causes a greater contrast in reflected alignment illumination such that alignment is easier to detect.

For a better understanding of the present invention, together with other and further aspects thereof, reference is made to the following description, taken in conjunction with the accompanying drawings. The scope of the invention is set forth in the appended clams.

BRIEF DESCRIPTION OF THE DRAWINGS

FIG. 1a is a schematic, cross sectional view of a portion of a row of charge trapping dielectric memory cells with a bit line oxide structure in accordance with the prior art;

FIG. 1b is a schematic, cross sectional view of a portion of a row of charge trapping dielectric memory cells with a planar structure in accordance with the prior art;

FIG. 3c is a schematic cross sectional view of a portion of the wafer during a processing step in the fabrication process of a charge trapping dielectric memory cell array in accordance with one embodiment of this invention;

FIG. 3d is a schematic cross sectional view of a portion of the wafer during a processing step in the fabrication process of a charge trapping dielectric memory cell array in accordance with one embodiment of this invention;

FIG. 3g is a schematic cross sectional view of a portion of the wafer during a processing step in the fabrication process of a charge trapping dielectric memory cell array in accordance with one embodiment of this invention;

FIG. 3h is a schematic cross sectional view of a portion of the wafer during a processing step in the fabrication process of a charge trapping dielectric memory cell array in accordance with one embodiment of this invention;

DESCRIPTION OF THE PREFERRED EMBODIMENTS

Figure 2A:
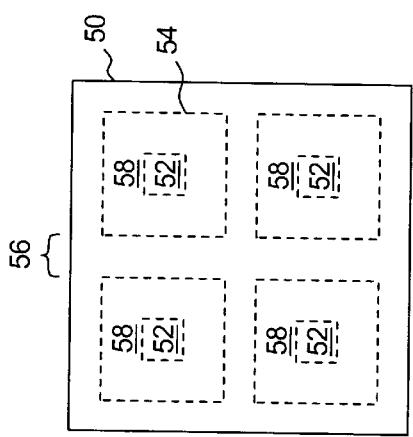
FIG. 2 represents a plan view of a portion of a wafer that is within the projection field of a photolithography mask in accordance with one embodiment of the present invention.

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

FIG. 2a represents a plan view of a portion of a wafer 50 in accordance with the present invention. The portion of the wafer 50 is the portion that is within the projected image of patterned illumination produced by a lithography mask during fabrication. The portion within the projected image may include a total of four dies 54 separated by scribe lanes 56. Each die 54 may comprise a core region 52 in which a planar array of charge trapping dielectric memory cells is fabricated and a periphery region 58 in which logic transistors are fabricated for the control circuitry for storing, reading, and erasing data from the array of memory cells.

Figure 2B:
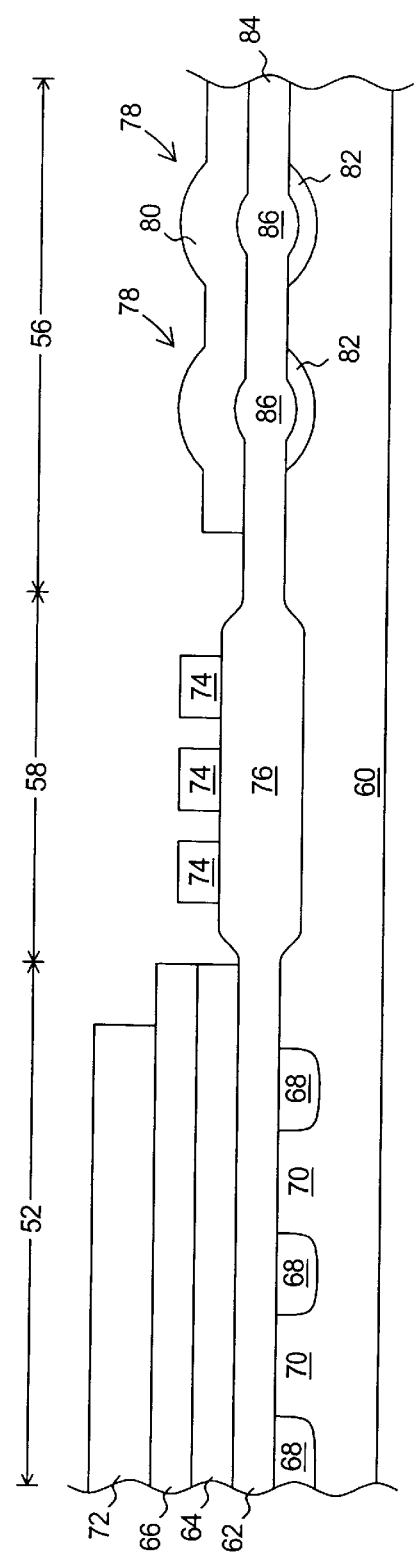

FIG. 2b represents a cross section of a portion of the wafer 50 that includes a portion of a core region 52, a periphery region 58, and a scribe lane 56. Within the core region 52, the array of charge trapping dielectric memory cells comprise a composite charge trapping dielectric layer on the surface of the wafer. The composite charge trapping dielectric layer comprises a vertical stack of a tunnel dielectric layer 62, a charge trapping dielectric layer 64, and a top dielectric layer 66 on the surface of the substrate 60 of the wafer 50. The tunnel dielectric layer 62 is adjacent to the substrate 60 and may be silicon dioxide grown on the surface of the substrate 60. The charge trapping layer 64 is adjacent to the tunnel dielectric layer 62 and separated from the substrate by the tunnel dielectric layer 62. The top dielectric layer 66 is adjacent to the charge trapping layer 64 and separated from the substrate 60 by both the tunnel dielectric layer 62 and the charge trapping layer 64.

Within the substrate 60 are a plurality of parallel, and spaced apart, bit line implants 68 which define a plurality of channel regions 70, each of which is between adjacent bit line implants 68. Above the top dielectric layer 66 are a plurality of parallel, spaced apart, polysilicon word lines 72 which are perpendicular to the bit line implants 68 and the channel regions 70. Each dielectric memory cell is defined by an intersection of a polysilicon word line 72 and a channel region 70.

Within the periphery region 58 an array of transistors comprises a plurality of polysilicon gates 74 separated from the substrate 60 by a gate oxide layer 76. Within the substrate 60 may be source, drain, and well implants in accordance with known CMOS technology such that each polysilicon gate 74 forms a field effect transistor.

Within the scribe lane region 56 there is an array of oxide protrusions 86 (e.g. an increase in thickness) within an oxide layer 84. Above the protrusions 86 is a layer of polysilicon 80 which generally follows the contour of the protrusions and functions to increase the contrast of the optical alignment signal provided by reflecting illumination from the array of optical locator protrusions 78 formed by the surface height variations of the oxide protrusions 86.

It should be appreciated that although the core region 52 and the periphery region 58 of the wafer 50 are planar and do not modulate reflected alignment illumination to provide an optical alignment signal effective for alignment of critical masks, the surface height variations of the array of optical locator protrusions 86 within the scribe lane region 56 do modulate reflected alignment illumination to provide an optical alignment signal that is useful for aligning critical masks of a photolithography process.

Figure 3A:
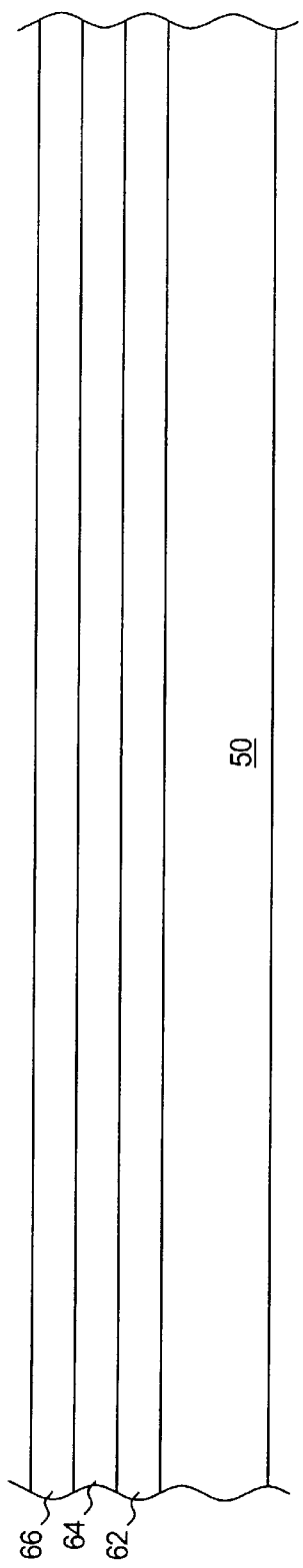
FIG. 3a is a schematic cross sectional view of a portion of the wafer during a processing step in the fabrication process of a charge trapping dielectric memory cell array in accordance with one embodiment of this invention.
Figure 3B:
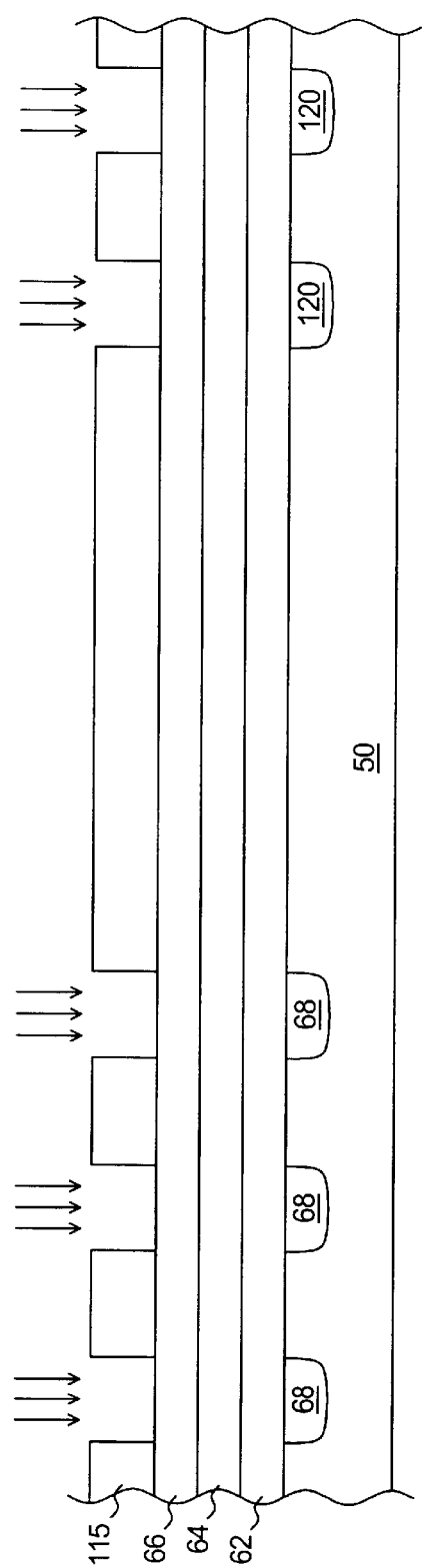
FIG. 3b is a schematic cross sectional view of a portion of the wafer during aprocessing step in the fabrication process of a charge trapping dielectric memory cell array in accordance with one embodiment of this invention.
Figure 3E:
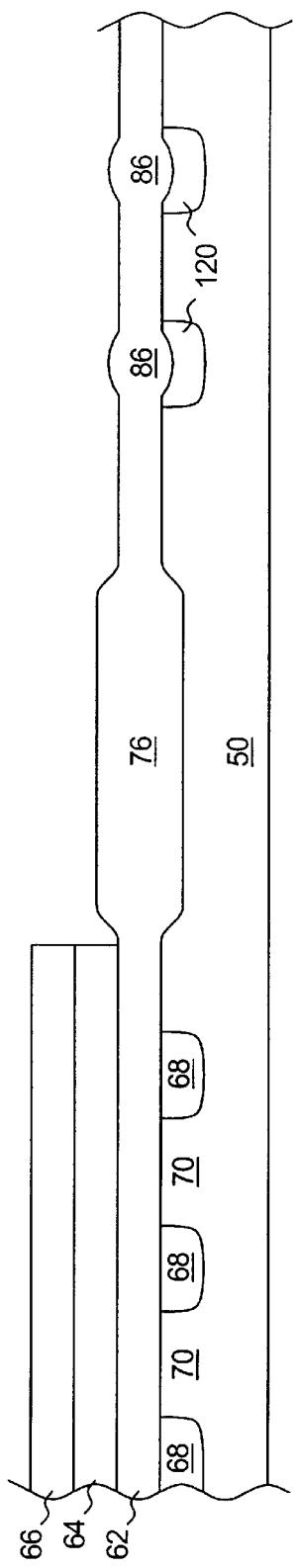
FIG. 3e is a schematic cross sectional view of a portion of the wafer during a processing step in the fabrication process of a charge trapping dielectric memory cell array in accordance with one embodiment of this invention.
Figure 3F:
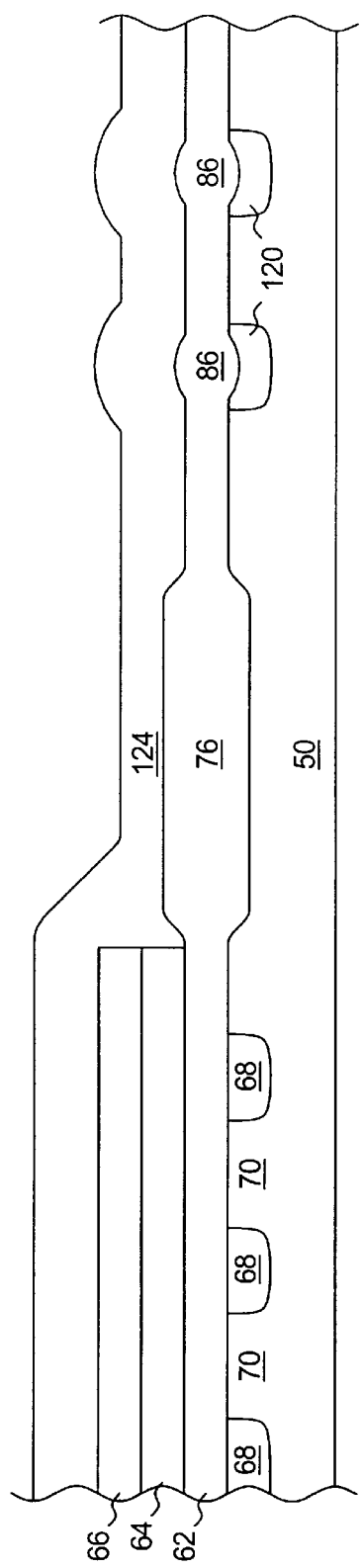
FIG. 3f is a schematic cross sectional view of a portion of the wafer during a processing step in the fabrication process of a charge trapping dielectric memory cell array in accordance with one embodiment of this invention.
Figure 4:
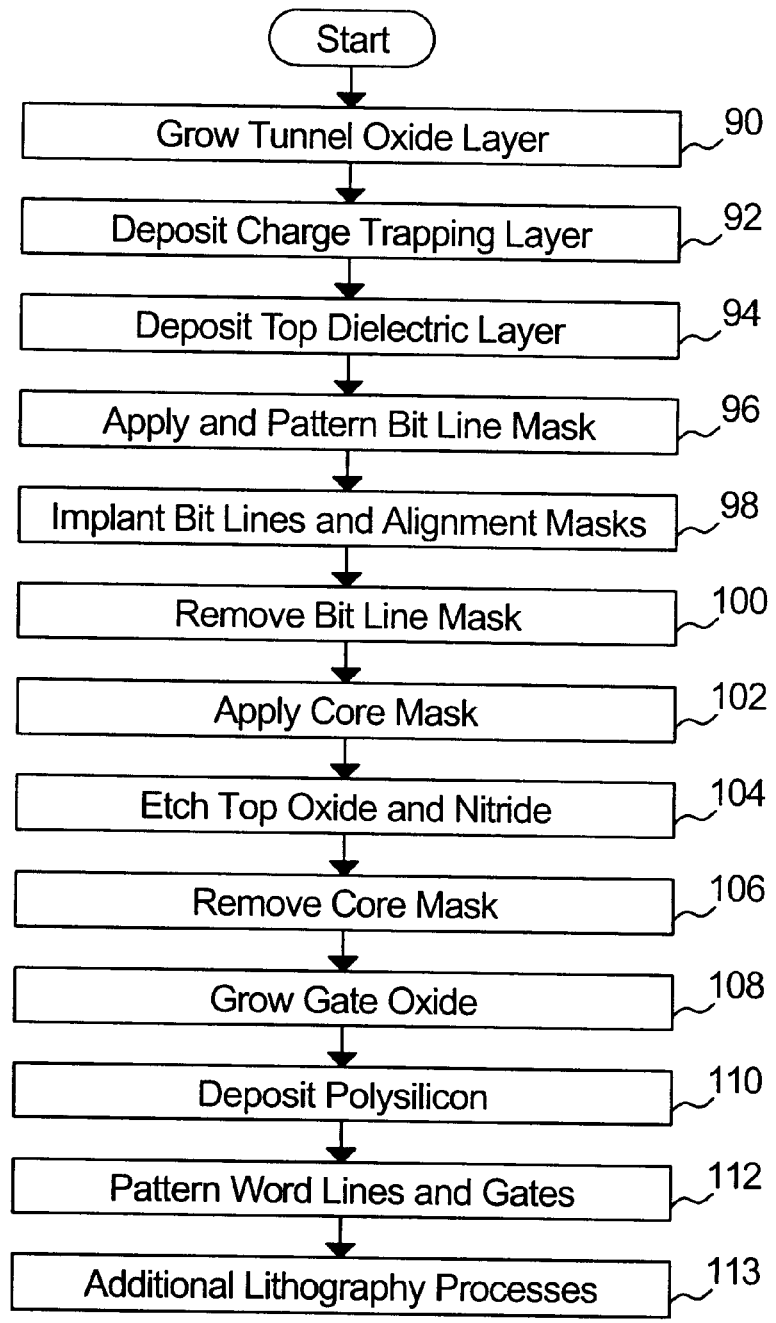
FIG. 4 is a flow chart showing exemplary steps for fabricating a charge trapping dielectric memory cell array in accordance with one embodiment of the present invention.

The flow chart of FIG. 4 represents exemplary processing steps for fabricating the wafer 50. The processing steps are arranged such that structure in each of the core region 52 and scribe lane region 56 is fabricated using common processing steps. Each of FIGS. 3a through FIG. 3h represents a cross section of a portion of the wafer 50 at various stages in the fabrication process of FIG. 4.

Step 90, of the flow chart of FIG. 4, represents fabricating the tunnel dielectric layer 62 across the entire surface of the wafer 50. In the exemplary embodiment, the tunnel dielectric layer 62 is silicon dioxide that is grown on the surface of the wafer to a thickness within a range of about 50 angstroms to about 150 angstroms. An embodiment with a more narrow bracket includes a thickness of the tunnel dielectric layer 62 within a range of about 60 angstroms to about 90 angstroms and even narrower yet, a tunnel dielectric layer 62 with a thickness of about 70 angstroms to about 80 angstroms.

Step 92 represents depositing the charge trapping layer 64 on the surface of the tunnel dielectric layer 62. The charge trapping layer 62 may comprise a nitride compound with suitable charge trapping properties and may have a thickness on the order of 20 angstroms to 100 angstroms. A narrower range may include a thickness on the order of 30 angstroms to 50 angstroms. The minimum thickness is a thickness such that non-uniformities in the charge trapping layer 62 thickness do not detrimentally effect operation. In the exemplary embodiment, the nitride compound may be selected from the group consisting of $Si_2N_4$, $Si_3N_4$ and $SiO_xN_4$.

Step 94 represents depositing the top dielectric layer 66 on the surface of the charge trapping layer 64. The top dielectric layer 66 may be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrSi_xO_y$ and other materials with similarly high dielectric constants. If the top dielectric layer 66 is silicon dioxide, the layer 66 may have a thickness on the order of 60 to 100 angstroms. Alternatively, if the top dielectric layer 66 is a high K material, its electrical thickness may be on the order of 60 angstroms to 100 angstroms while its physical thickness may be within a range of about 70 angstroms to 130 angstroms. An embodiment with a more narrow bracket includes a top dielectric layer 66 with a physical thickness within a range of about 80 angstroms to about 120 angstroms and even narrower yet, a top dielectric layer 66 with a physical thickness of about 90 angstroms to about 100 angstroms. The wafer 50 with the sequentially applied tunnel dielectric layer 62, the charge trapping dielectric layer 64, and the top dielectric layer 66 is depicted in the cross section diagram of FIG. 3a.

Figure 5B:
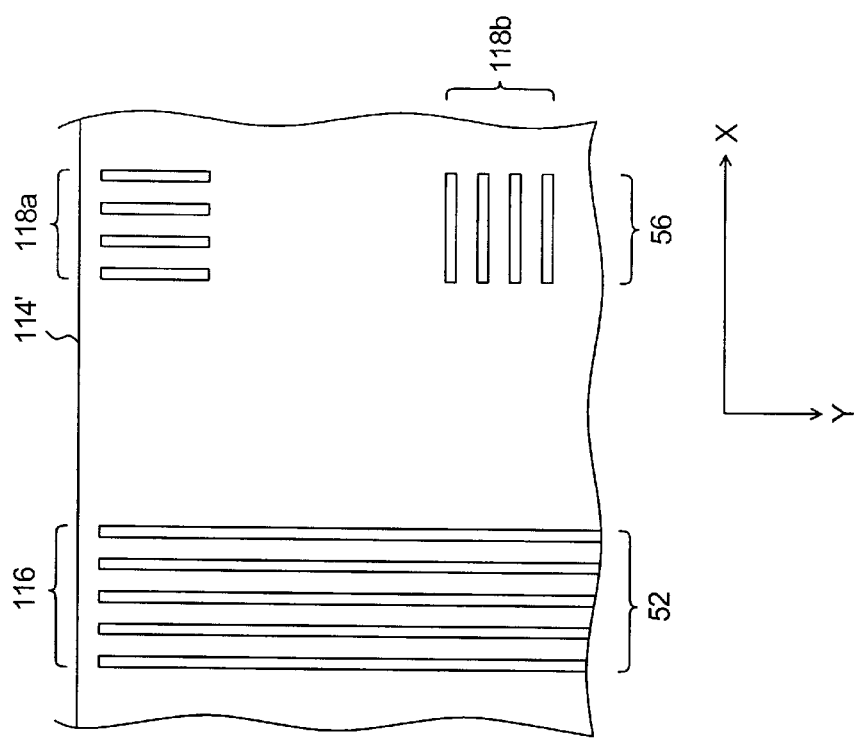
FIG. 5b is a diagram showing another exemplary bit line mask in accordance with a second embodiment of the present invention.
Figure 5A:
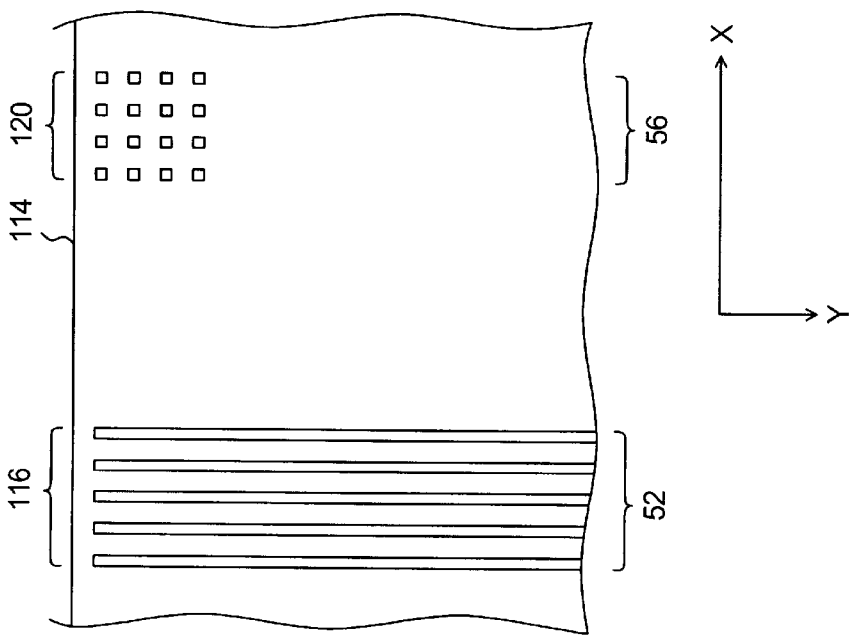
FIG. 5a is a diagram showing an exemplary bit line mask in accordance with one embodiment of the present invention.

Step 96 represents applying and etching a photoresist layer 115 on the surface of the top dielectric layer 66 as depicted in the cross section diagram of FIG. 3b. More specifically, the photoresist layer 115 may be spun onto the surface of the dielectric layer 66 using known techniques and patterned using patterned illumination from a bit line lithography mask 114 (FIGS. 5a and 5b). Following exposure, development of the photoresist layer 115 exposes (through apertures) the region for each of the parallel bit line implants 68 in the core region 52 of the wafer 50 and exposes a region for each oxide protrusion 86 within the periphery region 56 of the wafer 50.

FIG. 5a represents a first embodiment of a plan view of the bit line mask 114. The bit line mask 114 comprises a plurality of elongated apertures arranged in parallel and each defining a bit line implant in the core region 52. Within the scribe lane region 56, the mask 114 comprises at least one two-dimensional array of apertures 120 which defines a two dimensional array of oxide protrusions 86 that can be used to provide optical alignment in both the x-direction and the y-direction.

FIG. 5b represents a second embodiment of a plan view of a bit line mask 114'. The bit line mask 114', similar to the bit line mask 114, comprises a plurality of elongated apertures 116 arranged in parallel and each defining a bit line implant in the core region 52. Within the scribe lane region 56, the mask 114' comprises at least two one-dimensional arrays of elongated apertures 118a and 118b. The array of apertures 118a defines an array of oxide protrusions 86 that can be used to provide optical alignment in the x-direction and the array of apertures 118b defines an array of oxide protrusions 86 that can be used to provide optical alignment in the y-direction.

Returning to FIG. 4 in conjunction with FIG. 3b, step 98 represents implanting arsenic or another electron donor impurity through the exposed apertures in the photoresist layer 115 to form the bit line implants 68 in the core region 52 of the wafer 50 and to form one or more arrays of alignment implants 120 in the scribe lane region 56 of the wafer 50. In the exemplary embodiment, the implant may be performed with an implant does between $4 \times 10^{14}$ and $3 \times 10^{15}$ atoms per square centimeter and with an implant energy between 40 Kev and 100 Kev.

Step 100 represents removing the photoresist 115 and step 102 represents applying a photoresist layer 122 on the surface of the top dielectric layer 66 in the core region 52 as is depicted in FIG. 3c. The photoresist layer 122 covers the top dielectric layer 66 within the core region 52 while exposing the top dielectric layer 66 within periphery region 58 and the scribe lanes 56.

Following application of the photoresist 122, step 104 represents removing both the top oxide layer 66 and the charge trapping dielectric layer 64 from the surface of the tunnel dielectric layer 62 as is depicted in FIG. 3d. Step 104 may be performed using known etching techniques.

Step 106 represents removing the photoresist layer 122 utilizing known etching techniques and step 108 represents growing the gate oxide layer 76 in the periphery region 58 and the scribe lane region 56. In the exemplary embodiment, the gate oxide layer 76 is thermally grown. Step 108 also provides for growth of the oxide protrusions 86 in the scribe lane region 56 as is depicted in FIG. 3e. The implants 120 increase the oxidation rate of the substrate 60 which creates the oxide protrusions 86 during step 106.

In the exemplary embodiment, the step of growing the gate oxide layer 76 is calibrated to produce an oxide layer with a thickness within a range of 100 angstroms and 150 angstroms such that it adequately functions as a gate oxide for the transistors within the periphery region. The particular size of the oxide protrusions 86 formed is not controlled, but the resultant size is the size formed by the process calibrated to produce the appropriate thickness gate oxide layer 76

Step 110 represents deposing a polysilicon layer 124 across the entire wafer including the top dielectric layer 66 in the core region, the gate oxide 76 in the periphery region 58, and the oxide protrusions 86 in the scribe lane region 56.

Step 112 represents etching the polysilicon layer 124 to fabricate the word lines 72 and the gates 74 in the core region 52 and the periphery region 58. More specifically, a photoresist layer 79 is applied across the top surface of the polysilicon layer 124. The photoresist layer 79 is patterned using patterned illumination through a word line lithography mask.

Those skilled in the art will appreciate that it is desirable to assure that patterned illumination from the word line lithography mask aligns with the bit line implants 68 (defined by the bit line lithography mask). As such, an alignment system 122 provides alignment illumination 124 in the scribe lane region 56 and detects differential reflected illumination 126 due to the height variations of the oxide protrusions 86. More specifically, the height variations of the oxide protrusions are replicated in the polysilicon layer 76 and the photoresist layer 78.

After the photoresist 79 is patterned and developed, it covers the word lines 72 within the core region 52, the gates 74 within the periphery region 58, and the oxide protrusions 86 within the scribe lane region 56. The polysilicon layer 124 is then etched to define the word lines 72 and the gates 74.

It should be appreciated that due to the high reflectivity of polysilicon, the accuracy of detecting surface height variations is greater when the alignment illumination 124 is reflected from the polysilicon layer than the accuracy when reflected from the oxide protrusions 86. As such, it is desirable for the photoresist 79 to cover the polysilicon layer 76 within the scribe lane region 56 such that it is unaffected by the etching to define the word lines 72 and the gates 74. The polysilicon layer 76 thereby remains over the oxide protrusions 86 for alignment of subsequent masks during subsequent processing steps.

Figure 3I:
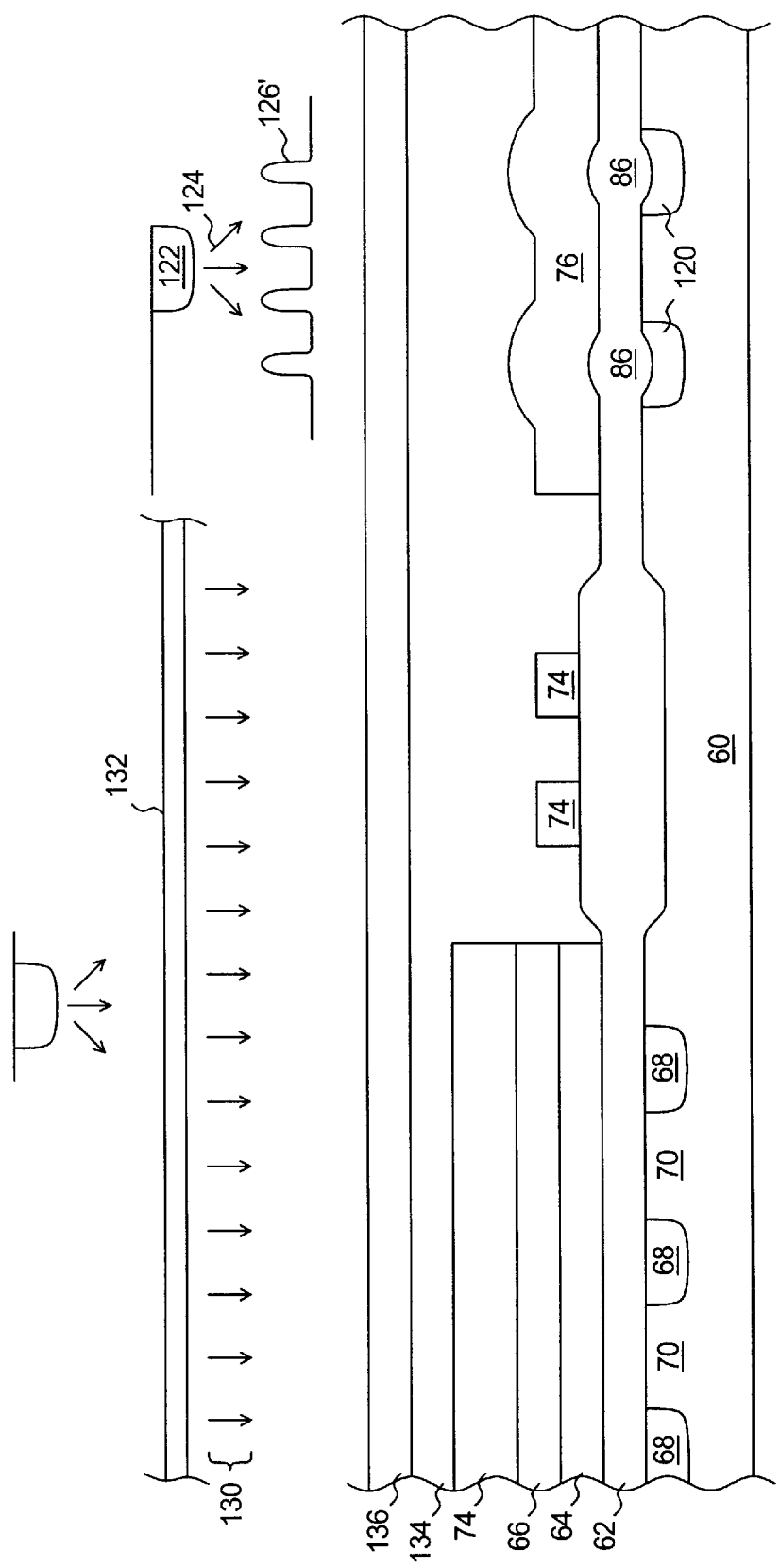
FIG. 3i is a schematic cross sectional view of a portion of the wafer during a processing step in the fabrication process of a charge trapping dielectric memory cell array in accordance with one embodiment of this invention.

Referring to FIG. 3i, step 113 represents additional lithography processing steps, such as contact formation, wherein patterned illumination is utilized to expose a photoresist 136 on the top surface of the wafer. Those skilled in the art will appreciate that it is desirable to assure that patterned illumination 130 from a mask 132 for contact formation (and other critically aligned structures) align with the bit line implants 68 (defined by the bit line lithography mask) and the word lines (defined by the second lithography mask). As such, the alignment system 122 provides alignment illumination 124 in the scribe lane region 56 and detects differential reflected illumination 126' from the surface of the photoresist 136 caused by the height variations of the oxide protrusions 86.

Note that in the scribe lane region, the polysilicon layer 76 remains over the oxide protrusions 86. The high surface reflectivity of the polysilicon layer 76 causes the differential illumination 126' reflected from the photoresist 136 to be a stronger pattern than the differential reflected illumination 126 would be had the photoresist (and borophosphosilicate glass "BPSG" 134) been directly over the oxide protrusions 86 (e.g without the polysilicon layer 76).

In summary, the teachings of this invention provide for better alignment of masks between critical lithography steps and thereby provides for fabrication of a smaller cells with higher dimensional tolerances. Although the processes of this invention have been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A method of fabricating a planar architecture charge trapping dielectric memory cell array, the method comprising:

exposing a first photoresist to a first illumination pattern from a first mask to simultaneously pattern bit line regions and alignment mark regions, the bit line regions being in a core region of the wafer;

simultaneously implanting an impurity into the wafer within the bit line regions and the alignment mark regions;

growing an oxide on surface of the wafer in the alignment mark regions to produce oxide protrusions within the alignment mark regions; and exposing a second photoresist to a second illumination pattern from a second mask to pattern word line regions within the core region of the wafer and utilizing surface height variations of the oxide protrusions to detect alignment between the second mask and the first mask.

2. The method of claim 1, further comprising:

applying a layer of polysilicon over the surface;

applying the second photoresist over the surface of the layer of polysilicon; and wherein the step of exposing the second photoresist to a second illumination pattern from a second mask to pattern word line regions within the core region of the wafer comprises utilizing surface height variations in the second photoresist over surface height variations in the layer of polysilicon over the oxide protrusions to detect alignment between the second mask and the first mask.

3. The method of claim 2, further comprising:

developing the second photoresist to mask the word line regions within the core region of the wafer and to mask the oxide protrusions; and etching the layer of polysilicon to form polysilicon word lines within the core region of the wafer.

4. The method of claim 3, wherein:

developing the second photoresist further masks transistor gates within a periphery region of the wafer; and etching the layer of polysilicon further forms transistor gates within the periphery region of the wafer.

5. The method of claim 1, wherein the oxide protrusions are within a scribe lane region of the wafer.

6. A method of fabricating a planar architecture charge trapping dielectric memory cell array, the method comprising:

applying a composite charge trapping dielectric over the surface of a semiconductor wafer;

applying a first photoresist over the surface of the composite charge trapping dielectric;

exposing the first photoresist to a first illumination pattern from a first mask to simultaneously pattern bit line regions and alignment mark regions, the bit line regions being in a core region of the semiconductor wafer;

etching the first photoresist to expose the composite charge trapping dielectric within the bit line regions and within the alignment mark regions;

simultaneously implanting an impurity into the exposed bit line regions and the exposed alignment mark regions;

removing the first photoresist;

applying a protective mask over the core region and exposing the composite charge trapping dielectric within alignment mark regions;

removing at least a portion of the composite charge trapping dielectric in the alignment mark regions to expose at least one of the semiconductor wafer and an oxide on the surface of the semiconductor wafer in the alignment mark region;

removing the protective mask over the core region; growing an oxide on the exposed alignment mark regions to produce oxide protrusions within the alignment mark regions;

applying a layer of polysilicon over the surface;

applying a second photoresist over the surface of the layer of polysilicon; and exposing the second photoresist to a second illumination pattern from a second mask to pattern word line regions within the core region and to mask the alignment mark regions utilizing surface height variations of the oxide protrusions to detect alignment between the second mask and the first mask.

7. The method of claim 6, wherein the composite charge trapping dielectric comprises a tunnel dielectric layer, a charge trapping dielectric layer, and a top dielectric layer and wherein the step of applying a composite charge trapping dielectric over the surface of the wafer comprises:

applying the tunnel dielectric layer on the surface of the wafer;

applying the charge trapping dielectric layer on the surface of the tunnel dielectric layer; and applying the top dielectric layer on the surface of the charge trapping dielectric layer.

8. The method of claim 7, wherein the tunnel dielectric layer is an oxide and the step of applying the tunnel dielectric layer on the surface of the wafer comprises growing the oxide on the surface of the wafer.

9. The method of claim 8, wherein the step of removing at least a portion of composite the charge trapping dielectric in the alignment mark region to expose at least one of the semiconductor wafer and an oxide on the surface of the semiconductor wafer in the alignment mark region comprises:

etching the top dielectric layer to expose the charge trapping dielectric layer; and etching the charge trapping dielectric layer to expose the tunnel dielectric layer.

10. The method of claim 9, wherein the alignment mark region is within a scribe lane region of the wafer.

11. The method of claim 6, wherein the step of applying a protective mask over the core region comprises:

applying a third photoresist over the surface of the charge trapping dielectric;

exposing the third photoresist to patterned illumination from a third mask to pattern the core region; and developing the third photoresist to expose the composite charge trapping dielectric within the alignment mark region.

12. The method of claim 11, wherein the composite charge trapping dielectric comprises a tunnel dielectric layer, a charge trapping dielectric layer, and a top dielectric layer and wherein the step of applying a composite charge trapping dielectric over the surface of the wafer comprises:

applying the tunnel dielectric layer on the surface of the wafer;

applying the charge trapping dielectric layer on the surface of the tunnel dielectric layer; and applying the top dielectric layer on the surface of the charge trapping dielectric layer.

13. The method of claim 12, wherein the tunnel dielectric layer is an oxide and the step of applying the tunnel dielectric layer on the surface of the wafer comprises growing the oxide on the surface of the wafer.

14. The method of claim 13, wherein the step of removing at least a portion of the composite charge trapping dielectric in the alignment mark region to expose at least one of the semiconductor wafer and an oxide on the surface of the semiconductor wafer in the alignment mark region comprises:

etching the top dielectric layer to expose the charge trapping dielectric layer; and etching the charge trapping dielectric layer to expose the tunnel dielectric layer.

15. The method of claim 14, wherein the alignment mark region is within a scribe lane region of the wafer.

16. The method of claim 15, wherein:

the step of applying a layer of polysilicon over the core region further comprises applying the layer of polysilicon over the oxide protrusions within alignment mark region; and the step of exposing a second photoresist to a second illumination pattern from a second mask to pattern word line regions within the core region utilizes a reflected illumination pattern caused by surface height variations in the second photoresist over surface height variations in the layer of polysilicon over the oxide protrusions to detect alignment between the second mask and the first mask.

17. The method of claim 16, wherein:

the step of applying a layer of polysilicon over the core region further comprises applying the layer of polysilicon over a periphery region of the semiconductor wafer that is positioned between the core region and the scribe lane region;

the step of exposing a second photoresist to a second illumination pattern from a second mask to pattern word line regions further patterns transistor gates within the periphery region.

18. The method of claim 17, wherein the composite charge trapping dielectric comprises a tunnel dielectric layer, a charge trapping dielectric layer, and a top dielectric layer and wherein the step of applying a composite charge trapping dielectric over the surface of the wafer comprises:

applying the tunnel dielectric layer on the surface of the wafer;

applying the charge trapping dielectric layer on the surface of the tunnel dielectric layer; and applying the top dielectric layer on the surface of the charge trapping dielectric layer.

19. The method of claim 18, wherein the tunnel dielectric layer is an oxide and the step of applying the tunnel dielectric layer on the surface of the wafer comprises growing the oxide on the surface of the wafer.

20. The method of claim 19, wherein the step of removing at least a portion of the composite charge trapping dielectric in the scribe lane region to expose at least one of the semiconductor wafer and an oxide on the surface of the semiconductor wafer in the scribe lane region comprises:

etching the top dielectric layer to expose the charge trapping dielectric layer; and etching the charge trapping dielectric layer to expose the tunnel dielectric layer.

21. The method of claim 19, wherein the step of applying a protective mask over the core region comprises:

applying a third photoresist over the surface of the charge trapping dielectric;

exposing the third photoresist to patterned illumination from a third mask to pattern the core region; and developing the third photoresist to expose the charge trapping dielectric within the scribe lane region.

22. The method of claim 20, wherein the composite charge trapping dielectric comprises a tunnel dielectric layer, a charge trapping dielectric layer, and a top dielectric layer and wherein the step of applying a composite charge trapping dielectric over the surface of the wafer comprises:

applying the tunnel dielectric layer on the surface of the wafer;

applying the charge trapping dielectric layer on the surface of the tunnel dielectric layer; and applying the top dielectric layer on the surface of the charge trapping dielectric layer.

23. The method of claim 22, wherein the tunnel dielectric layer is an oxide and the step of applying the tunnel dielectric layer on the surface of the wafer comprises growing the oxide on the surface of the wafer.

24. The method of claim 23, wherein the step of removing at least a portion of the composite charge trapping dielectric in the scribe lane region to expose at least one of the semiconductor wafer and an oxide on the surface of the semiconductor wafer in the scribe lane region comprises:

etching the top dielectric layer to expose the charge trapping dielectric layer; and etching the charge trapping dielectric layer to expose the tunnel dielectric layer.

* * * * *